(12) United States Patent
Pavan

(10) Patent No.: US 7,142,596 B2
(45) Date of Patent: Nov. 28, 2006

(54) INTEGRATED CIRCUIT IMPLEMENTATION FOR POWER AND AREA EFFICIENT ADAPTIVE EQUALIZATION

(75) Inventor: Shanthi Pavan, Madras (IN)

(73) Assignees: Vitesse Semiconductor Corporation, Camarillo, CA (US); Indian Institute of Technology, Madras (IN)

( * ) Notice: Subject to any disclaimer, the term of this patent is extended or adjusted under 35 U.S.C. 154(b) by 224 days.

(21) Appl. No.: 10/872,307

(22) Filed: Jun. 17, 2004

(65) Prior Publication Data

US 2005/0281362 A1    Dec. 22, 2005

(51) Int. Cl.
*H03H 7/30*    (2006.01)
(52) U.S. Cl. .................. 375/232; 375/229; 331/137
(58) Field of Classification Search ............ 375/232, 375/350, 229; 331/117 R, 140, 137
See application file for complete search history.

(56) References Cited

U.S. PATENT DOCUMENTS

| | | | |
|---|---|---|---|
| 6,118,205 A * | 9/2000 | Wood et al. ........... | 310/316.01 |
| 6,178,101 B1 * | 1/2001 | Shires .................. | 363/39 |
| 2002/0145481 A1 * | 10/2002 | Murgulescu ........... | 331/117 R |

OTHER PUBLICATIONS

D.A. Johns et al., "Orthonormal Ladder Filters," IEEE Transactions on Circuits and Systems, vol. 36, No. 3, pp. 337-343 (Mar. 1989).
H. Wu et al., "Integrated Transversal Equalizers in High-Speed Fiber-Optic Systems," IEEE Journal of Solid-State Circuits, vol. 38, No. 12 (Dec. 2003).

* cited by examiner

*Primary Examiner*—Khai Tran
(74) *Attorney, Agent, or Firm*—Christie, Parker & Hale, LLP

(57) ABSTRACT

Methods, apparatuses, and systems are presented for performing channel equalization involving receiving a signal from a channel associated with inter-s interference (ISI), providing the received signal to an inductor, capacitor, resistance (LCR) network comprising a plurality of inductors and a plurality of capacitors, generating in the LCR network a first plurality of intermediate signals representing voltages associated with capacitors in the LCR network and a second plurality of intermediate signals representing currents associated with inductors in the LCR network, wherein the first plurality and second plurality of intermediate signals correspond to application of linearly independent impulse responses to the received signal, applying a corresponding one of a plurality of multiplier factors to each of the first plurality and second plurality of intermediate signals, and generating from the LCR network a resulting signal corresponding to an equalized version of the received signal.

47 Claims, 9 Drawing Sheets

INTEGRATED CIRCUIT IMPLEMENTATION FOR POWER AND AREA EFFICIENT ADAPTIVE EQUALIZATION

CROSS-REFERENCES TO RELATED APPLICATIONS

This application is filed concurrently with related U.S. patent application Ser. No. 10/872,108 filed Jun. 17, 2004 by Shanthi Pavan for "Power and Area Efficient Adaptive Equalization", the entire disclosure of which is incorporated by reference in this application for all purposes.

BACKGROUND OF THE INVENTION

Traditional approaches for performing adaptive equalization on a signal received from a channel associated with inter-symbol interference (151) typically involve conventional filtering techniques such as analog-to-digital conversion followed by processing by a digital finite impulse response (FIR) filter or use of a traveling wave FIR filter. These known filtering techniques are associated with fundamental limitations that become greatly exacerbated in dealing with wide bandwidth signals found in high-speed channels. Related U.S. patent application Ser. No. 10/872, 108 for "Power and Area Efficient Adaptive Equalization," listed above, further describes significant limitations associated with known adaptive equalization techniques such as a digital signal processing (DSP) FIR filter or a traveling wave FIR filter, and discloses techniques for performing filtering operations for adaptive equalization in an power and area efficient manner, especially for equalization of signals associated with high speed channels. Here, improved integrated circuit implementations associated with such techniques are presented.

BRIEF SUMMARY OF THE INVENTION

The present invention relates to methods, apparatuses, and systems for performing channel equalization involving receiving a signal from a channel associated with inter-symbol interference (ISI), providing the received signal to an inductor, capacitor, resistance (LCR) network comprising a plurality of inductors and a plurality of capacitors, generating in the LCR network a first plurality of intermediate signals representing voltages associated with capacitors in the LCR network and a second plurality of intermediate signals representing currents associated with inductors in the LCR network, wherein the first plurality and second plurality of intermediate signals correspond to application of linearly independent impulse responses to the received signal, applying a corresponding one of a plurality of multiplier factors to each of the first plurality and second plurality of intermediate signals, and generating from the LCR network a resulting signal corresponding to an equalized version of the received signal.

In one embodiment, applying a corresponding one of a plurality of multiplier factors involves detecting each of the first plurality and second plurality of intermediate signals and scaling each of the first plurality and second plurality of intermediate signals by the corresponding multiplier factor. In another embodiment, applying a corresponding one of a plurality of multiplier factors involves driving each of the first plurality and second plurality of intermediate signals according to the corresponding multiplier factor.

The LCR network may comprise a primary network and a dual network, the primary network comprising a plurality of primary inductors and primary capacitors, the dual network comprising a plurality of dual inductors corresponding to the primary capacitors and a plurality of dual capacitors corresponding to the primary inductors. Each of the first plurality of intermediate signals may be obtained as a voltage signal associated with a primary capacitor in the primary network, and each of the second plurality of intermediate signals may be obtained as a voltage signal associated with a dual capacitor in the dual network.

The LCR network may be implemented as a differential circuit, wherein each of the first plurality of intermediate signals represents a differential voltage associated with a pair of capacitors, and wherein each of the second plurality of intermediate signals represents current associated with at least one of a pair of inductors.

According to one embodiment, the pair of inductors are inductively coupled to one another. Currents in the pair of inductors flow in opposite directions, and the pair of inductors may be inter-wound such that magnetic fields of the inductors reinforce one another.

Further, the multiplier factors may be dynamically adjusted to reduce an error measure based on the resulting signal. The multiplier factors may be dynamically adjusted according to a least mean square (LMS) algorithm utilizing the first plurality and second plurality of intermediate signals as gradient signals.

In one embodiment of the invention, the corresponding multiplier factor is applied to each of the first plurality and second plurality of intermediate signals using a range-switched transconductor, the range-switched transconductor comprising a plurality of transconductor elements, each element capable of contributing to an output of the range-switched transconductor by generating an elemental output according to a different range of the corresponding multiplier factor.

DETAILED DESCRIPTION OF THE INVENTION

Integrated Circuit Design

Figure 1:
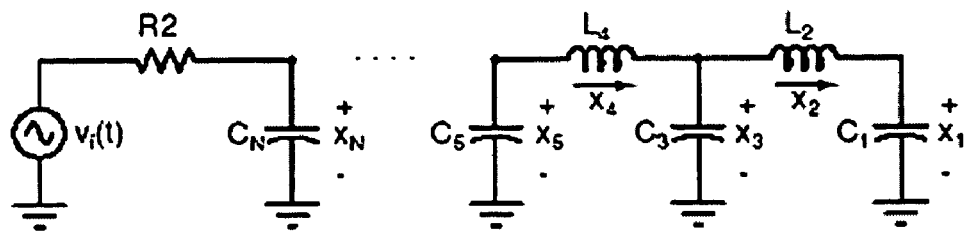
FIG. 1 illustrates a singly terminated inductor, capacitor, resistance (LCR) network filter in accordance with one embodiment of the invention.

FIG. 1 illustrates a singly terminated inductor, capacitor, resistance (LCR) network filter in accordance with one embodiment of the invention. The state variables of this network are the capacitor voltages and inductor currents. Here, the LCR network is represented as an LC ladder and comprises a plurality of inductors connected in series to form an inductor chain and a plurality of capacitors each connected between a position along the inductor chain and a common position, shown in the figure as "ground." Components in the network such as inductors, capacitors, resistors, or others, may be implemented as passive elements or active elements. For example, such active elements may be constructed using transistors. Each state can be treated as an output of the network.

As discussed in related U.S. patent application Ser. No. 10/872,108 for "Power and Area Efficient Adaptive Equalization", listed above, an LCR network may form the basis of an efficient design of a bank of N filters that is suitable for use as an adaptive equalizer. An equivalent FIR filter can be built using a linear combination of low bandwidth continuous-time filters. This approach can be extended to realize an FIR filter with an arbitrary number of taps. In one embodiment of the invention, the impulse responses are linearly independent impulse responses. In another embodiment of the invention, the impulse responses are linearly independent and orthogonal impulse responses. While it may only be desired that the sampled impulse responses be linearly independent, a linear combiner involving these responses may converge more quickly if these responses were orthogonal.

The state variables of a singly terminated LCR network may form a bank of N orthogonal filters. Thus, the state impulse responses of a singly terminated LCR network such as that shown in FIG. 1 may be configured to provide an orthonormal basis set for implementing an efficient adaptive equalizer. Further, the denominator polynomial of the LCR network may be chosen to be that of a Bessel lowpass filter. The equalizer associated with the LCR network shown in FIG. 1 may to be characterized by the following expression:

$$y(t) = \sum_{i=1}^{i=N} w_i x_i(t) \quad (1)$$

where y(t) represents an output of the network, $x_i(t)$ represents various capacitor voltage variables ($x_1(t)$, $x_3(t)$ . . . ) and inductor current variables ($x_2(t)$, $x_4(t)$ . . . ) in the network, and $w_i$ represents different weights applied these variables.

Figure 2:
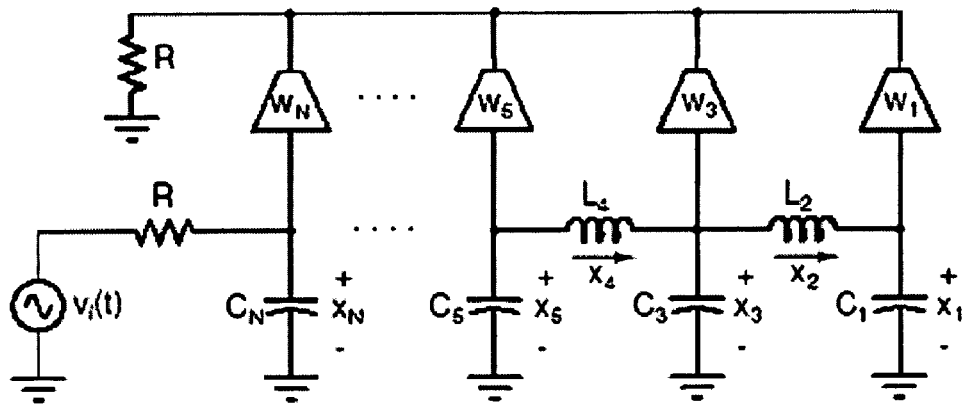
FIG. 2 presents a technique for obtaining a weighted summation of the capacitor voltage variables in accordance with one embodiment of the invention.

FIG. 2 presents a technique for obtaining a weighted summation of the capacitor voltage variables in accordance with one embodiment of the invention. As shown in the figure, the transconductors with strengths $w_1, w_3, \ldots, w_N$ generate currents which are summed across a resistor R.

Figure 3:
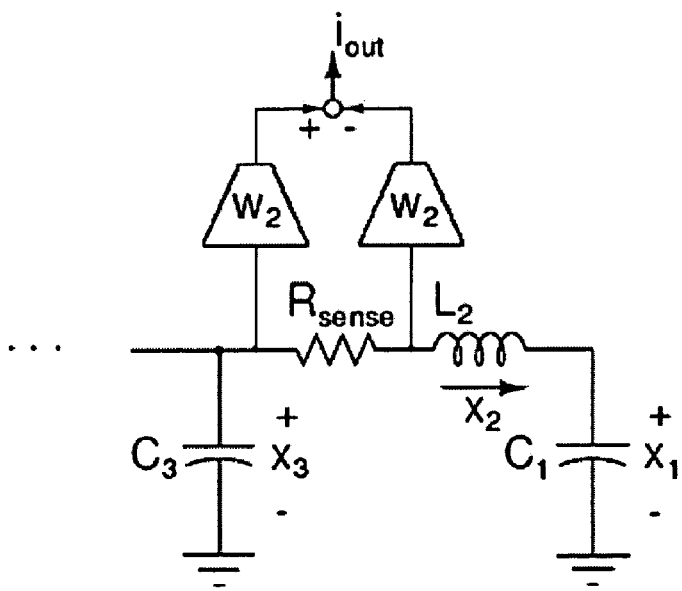
FIG. 3 depicts an approach for detecting inductor currents using a sense resistor, in accordance with one embodiment of the invention.

FIG. 3 depicts an approach for detecting inductor currents using a sense resistor, in accordance with one embodiment of the invention. Here, a small sense resistor $R_{sense}$ is inserted in series across every inductor in the circuit. The voltage drop across the resistor is converted into a current as shown in the figure.

Figure 4:
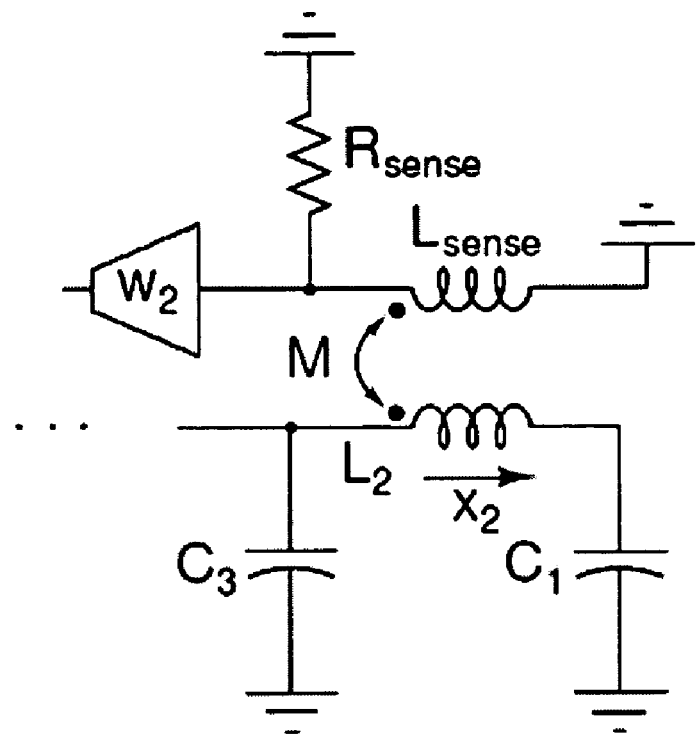
FIG. 4 depicts an approach for detecting inductor currents using a sense inductor, in accordance with one embodiment of the invention.

FIG. 4 depicts an approach for detecting inductor currents using a sense inductor, in accordance with one embodiment of the invention. As shown in the figure, the sense inductor is inductively coupled to the inductor of interest, and the current through the sense inductor is measured using a sense resistor. This measured current is used as a representation of the current through the inductor of interest.

Figure 5:
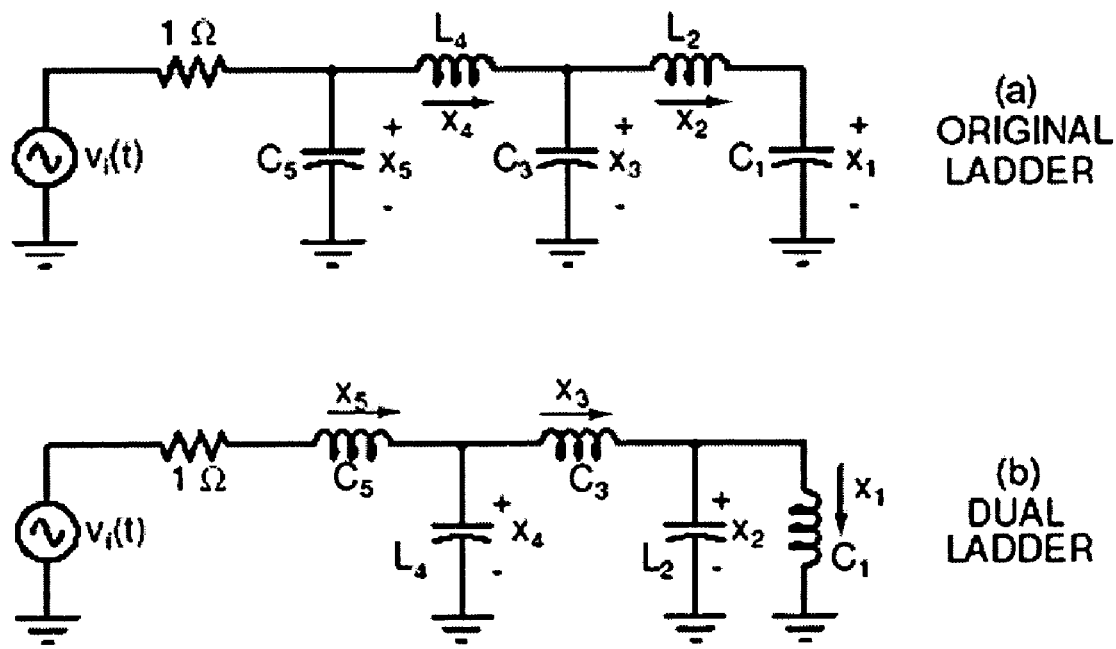
FIG. 5a shows a fifth order singly terminated LCR network.
FIG. 5b shows the dual network corresponding to FIG. 5a which allows inductor currents to be detected.

FIGS. 5a and 5b depict an approach for detecting inductor currents utilizing a dual network, in accordance with a preferred embodiment of the invention. Here, a dual network refers to a network in which the roles of current and voltage are interchanged. Accordingly, an inductor in the primary network corresponds to a capacitor in the dual network, and a capacitor in the primary network corresponds to an inductor in the dual network. FIG. 5a shows a fifth order singly terminated LCR network. For simplicity, the terminating resistance is set to 1Ω. FIG. 5b shows the dual network corresponding to FIG. 5a which allows inductor currents to be detected. By utilizing a dual network, all inductors in the primary network are transformed into corresponding capacitors in the dual network, and series connections are transformed to shunt connections. For example, for a 1Ω terminating impedance applied in the primary network and dual network shown in FIGS. 5a and 5b, the numerical values of the inductors in the primary network become the numerical values of capacitors in the dual network. The inductor currents in the primary network become capacitor voltages in the dual network, so that they can be conveniently tapped in a similar manner as presented in FIG. 2. Use of a dual network to detect inductor current in the present embodiment of the invention eliminates the need for sense resistors, which may add thermal noise and may contribute significantly to transconductor noise. Such contribution may be significant because sense resistor values are typically small. By eliminating sense resistors, any unwanted effects of sense resistors on the filter transfer function may also be avoided. Furthermore, use of a dual network to detect inductor currents as described here also eliminates the need for sense inductors, which may be require to be implemented at large values of $L_{sense}$ in order to generate a sufficiently strong signal across $R_{sense}$ as shown in FIG. 4.

Figure 6:
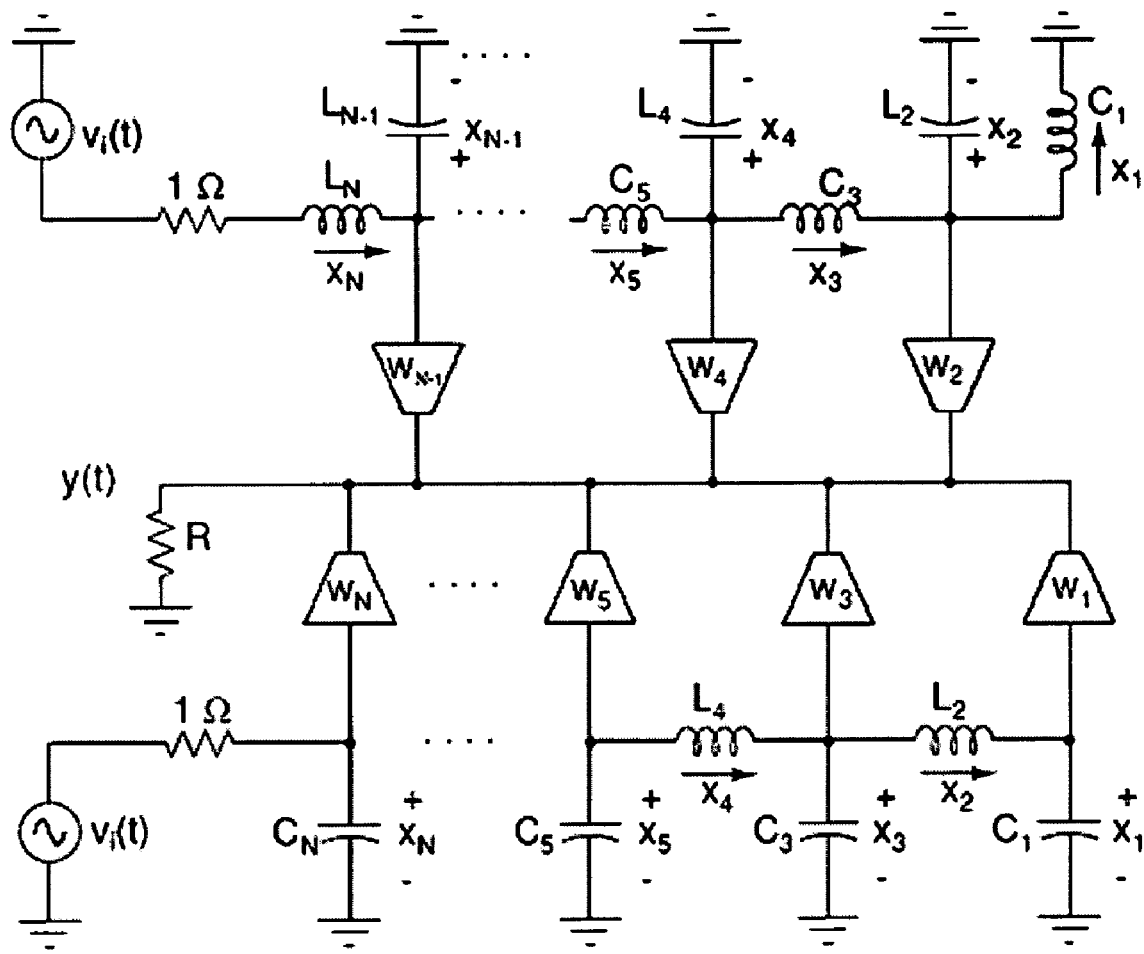
FIG. 6 presents an approach for obtaining a weighted summation of capacitor voltage variables and inductor current variables using a dual network, in accordance with one embodiment of the invention.

FIG. 6 presents an approach for obtaining a weighted summation of capacitor voltage variables and inductor current variables using a dual network, in accordance with one embodiment of the invention. In this figure, the lower LC ladder is the original, or primary, network. The upper LC ladder is the dual network. Programmable transconductors tap the capacitor voltages in both the primary and the dual network. The currents of the transconductors are summed across the resistor R, which may be used as the equalizer output.

Figure 7:
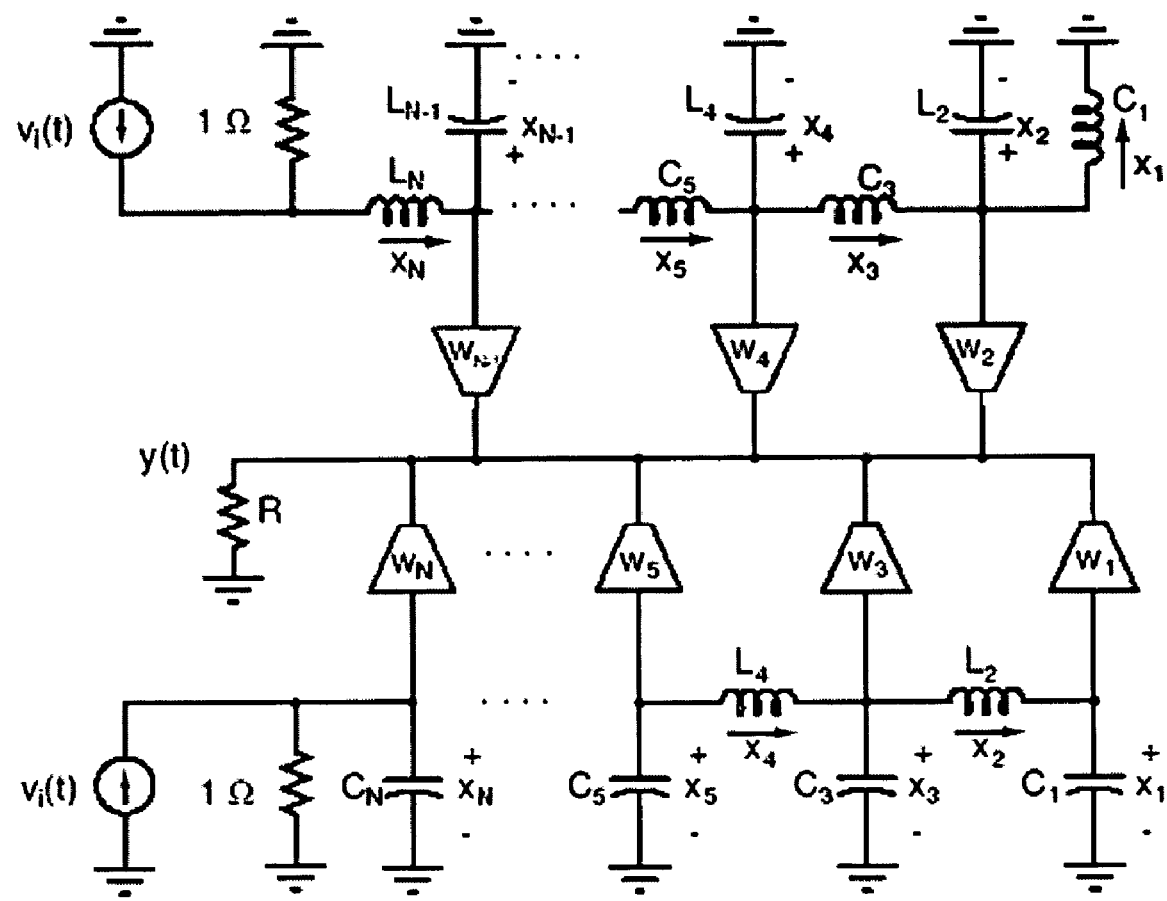
FIG. 7 illustrates a similar structure as that shown in FIG. 6, but with the input voltage source and the terminating resistor modified according to a Thevenin transformation.

FIG. 7 illustrates a similar structure as that shown in FIG. 6, but with the input voltage source and the terminating resistor modified according to a Thevenin transformation. Thus, the dual network is shown here as being driven by input current sources as opposed to voltage sources. FIG. 7 represents an arrangement suitable for integrated circuit implementation, since active devices typically are characterized as transconductance elements.

Figure 8:
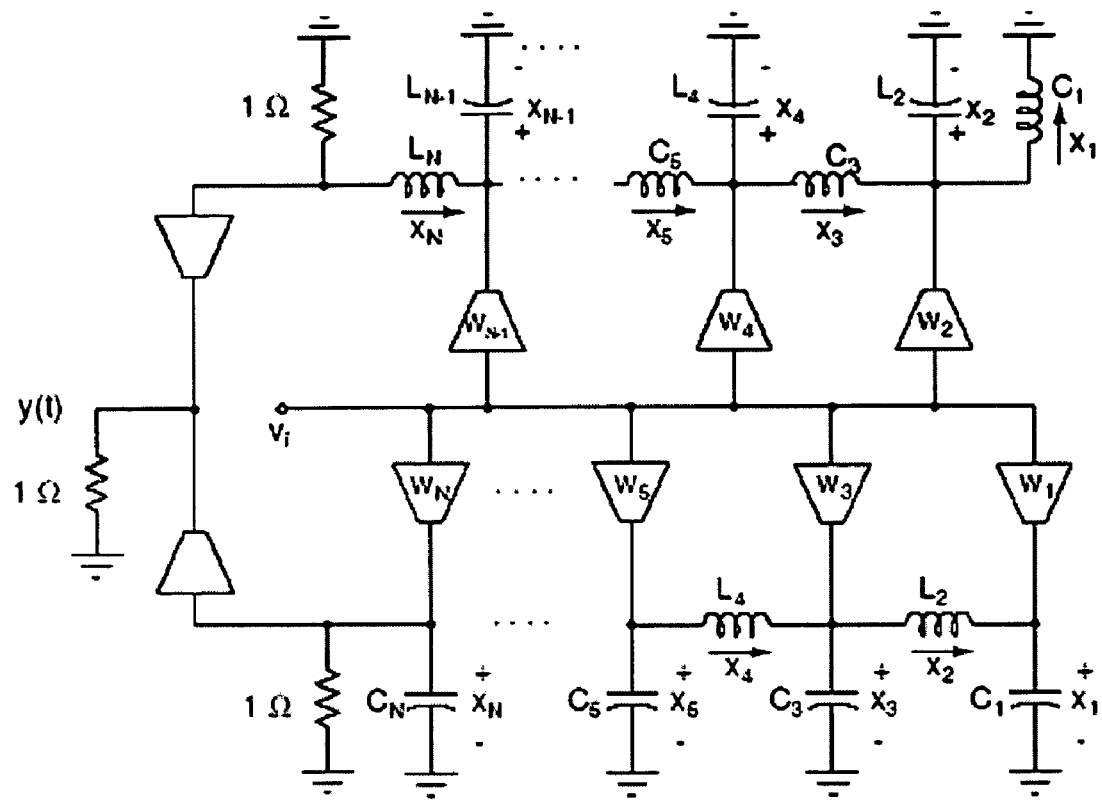
FIG. 8 presents an approach for obtaining a weighted summation of capacitor voltage variables and inductor current variables using a dual network, representing a companion form of the circuit presented in FIG. 7, in accordance with one embodiment of the present invention.

FIG. 8 presents an approach for obtaining a weighted summation of capacitor voltage variables and inductor current variables using a dual network, representing a companion form of the circuit presented in FIG. 7, in accordance with one embodiment of the present invention. Here, the principal of reciprocity allows locations of the input signal (excitation) and output signal (response) to be interchanged. This principle is exploited to obtain the companion form. As shown in FIG. 8, the positions of the input signal Vi(t) and output signal Y(t) have been interchanged relative to FIG. 7. The weighted sums of the state variables are available across the terminating resistors as voltages. These state variables are converted to currents using two transconductors, summed, and measured across a final resister as shown in FIG. 8.

When implemented, the companion form circuit shown in FIG. 8 may present particular advantages over the circuit in FIG. 7. For example, referring back to FIG. 7, in both the primary network shown at the bottom of the figure and the dual network shown at the bottom of the figure, transconductor outputs meet at a single node (the output). Thus, it is possible that output parasitic capacitances of the transconductors may contribute to substantial band limiting effects at this node. On the other hand, input parasitic capacitances of the transconductors may be less problematic, since they can be incorporated into the filter design by appropriately changing capacitance values such as $C_1$, C3, C5, . . . and L2, L4, L6, . . . . In the structure presented in FIG. 8, the output parasitic capacitances of the transconductors are no longer problematic, as they can be incorporated into the filter design by appropriately changing capacitance values such as $C_1$, C3, C5, . . . and L2, L4, L6, . . . . In FIG. 8, the input parasitic capacitances of the transconductors may load the input node. However, such capacitance may be accounted for with proper design of a filter (not shown) preceding the equalizer.

Figure 9:
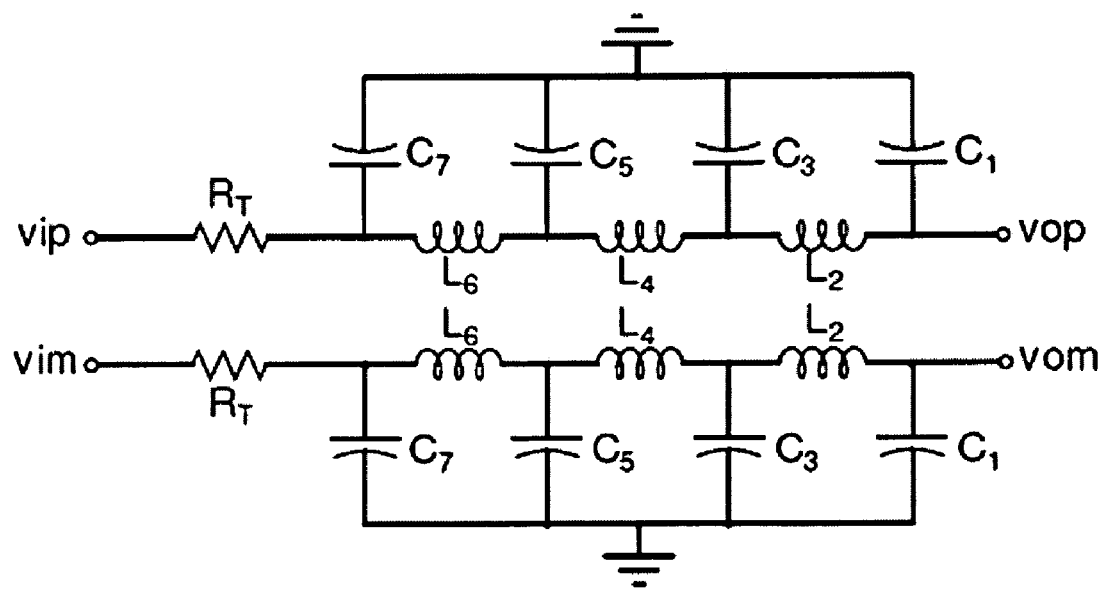
FIG. 9 illustrates a differential LCR network filter.

FIG. 9 illustrates a differential LCR network filter. A differential network such as that shown in FIG. 9 may be used to implement various LCR network filters presented in various embodiments of the present invention, to improve power supply rejection and common-mode rejection. As shown in the figure, a differential LCR network filter can be constructed from two single-ended filters. On an integrated circuit, this approach has the potential of occupying twice the area of a single ended filter.

Figure 10:
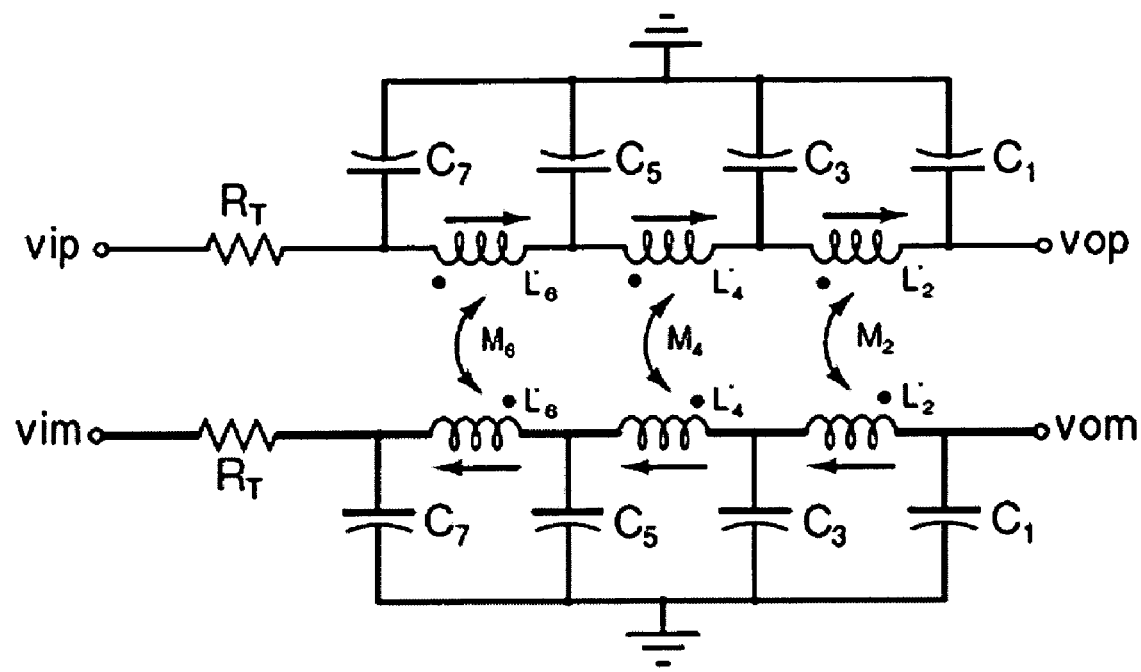
FIG. 10 illustrates a differential LCR network filter exhibiting mutual inductance.

FIG. 10 illustrates a differential LCR network filter exhibiting mutual inductance. The effect of mutual inductance may be utilized to decrease the area required for implementing a differential network. For example, the inductor having a value $L_2$ in FIG. 9 may be replaced in FIG. 10 by a smaller inductor having a value of $L'_2$ as a result of the added inductance $M_2$ attributed to effects of mutual inductance present in FIG. 10. This relationship may be represented by $L_2=L'_2+M_2$. According to the present embodiment of the invention and as shown in FIG. 10, currents in the two differential halves of the circuit may flow in opposite directions.

Figure 11:
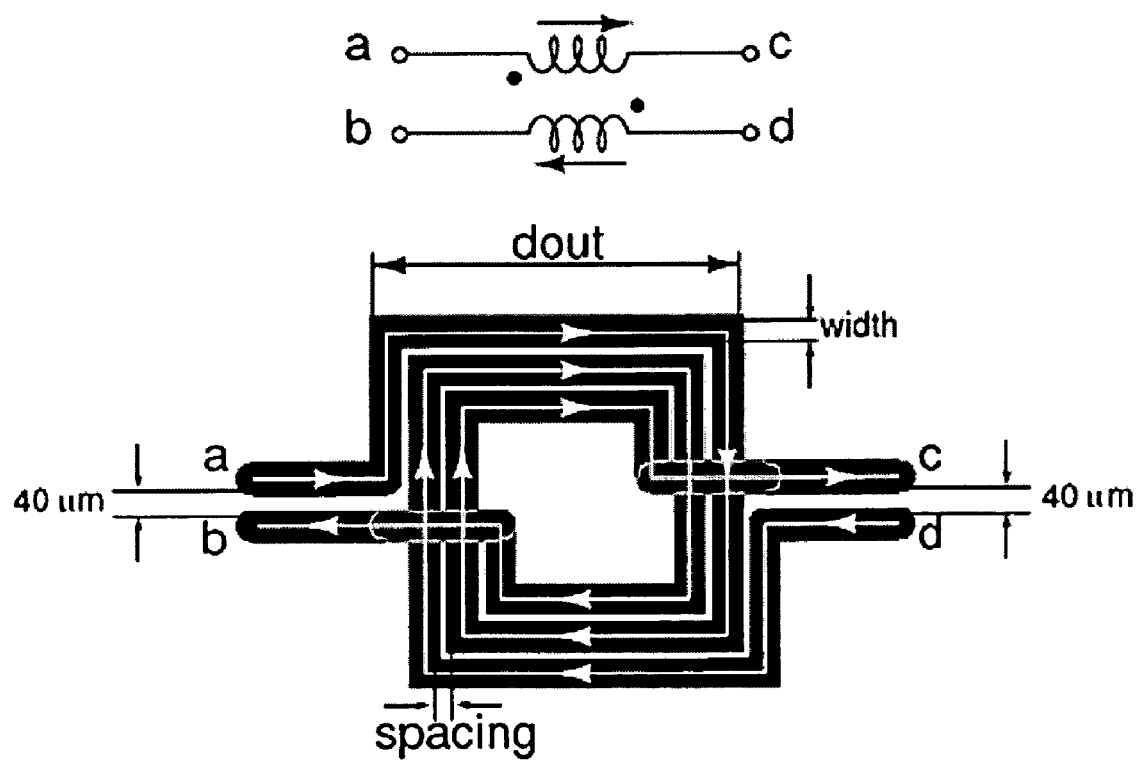
FIG. 11 presents a circuit layout and corresponding symbolic representation for a pair of differential floating inductors that may be implemented in one embodiment of the invention.

FIG. 11 presents a circuit layout and corresponding symbolic representation for a pair of differential floating inductors that may be implemented in one embodiment of the invention. As shown in this figure, the two inductors are inter-wound. While currents flow in opposite directions in the two individual inductors, the corresponding magnetic fields reinforce each other in the core of the inductor.

Figure 12:
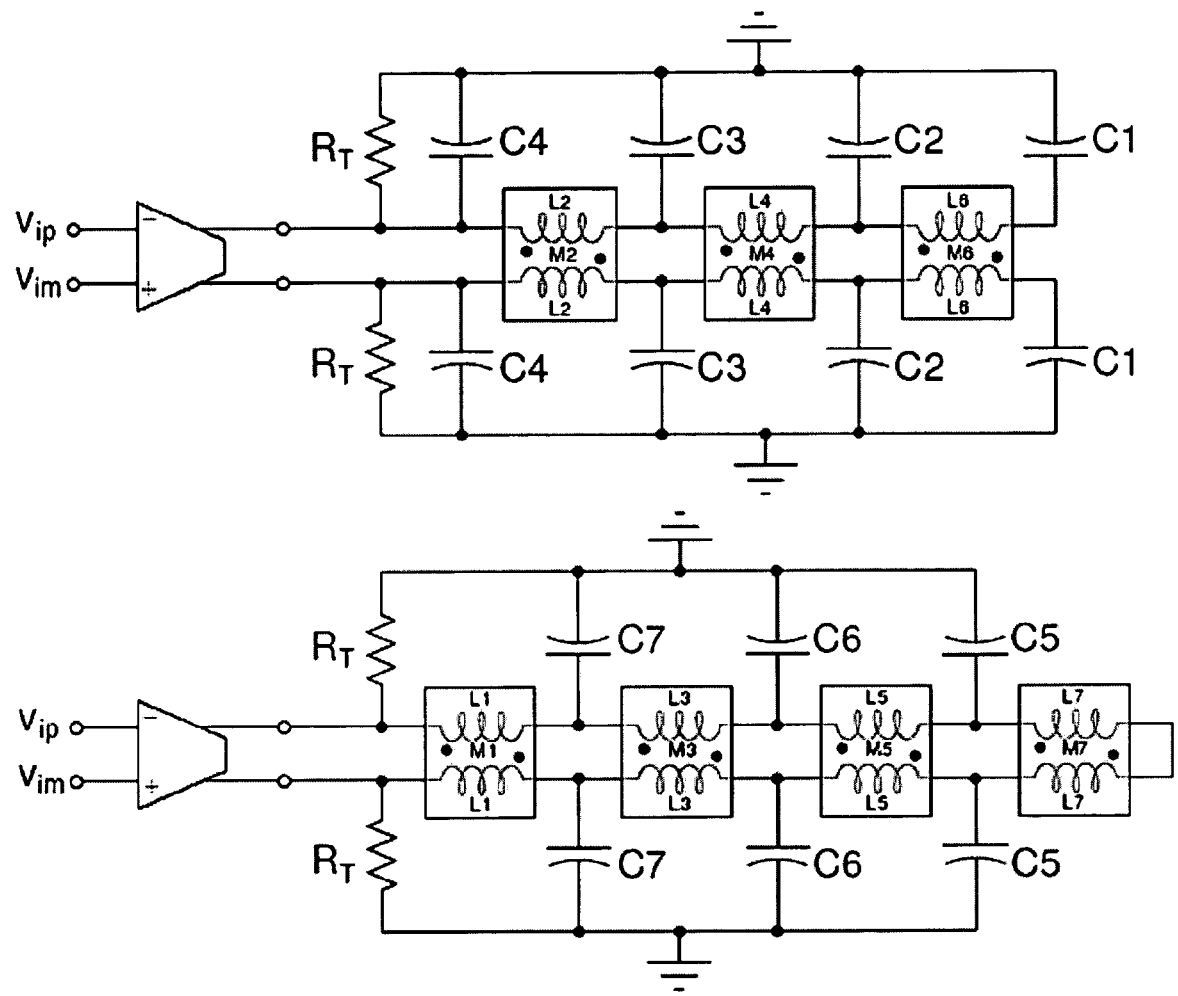
FIG. 12 illustrates a seventh order differential Bessel filter in the form of a primary network and its dual network, in accordance with one embodiment of the present invention.

FIG. 12 illustrates a seventh order differential Bessel filter in the form of a primary network and its dual network, in accordance with one embodiment of the present invention. The primary LCR network and the corresponding dual LCR network are both implemented in differential fashion, as described above. A specific design of this filter is described in detail below. The seventh order Bessel filter is designed with a 3 GHz bandwidth. The terminating resistor is chosen to be 50Ω. This choice of impedance level results in inductors in the range of few nH's and capacitors in the range of few hundreds of fF's. A seventh order Bessel filter and its dual would use 7 differentially coupled inductor pairs, as shown in the figure. The values of inductors required for a 3 GHz bandwidth were found from inductor tables.

Figure 13:
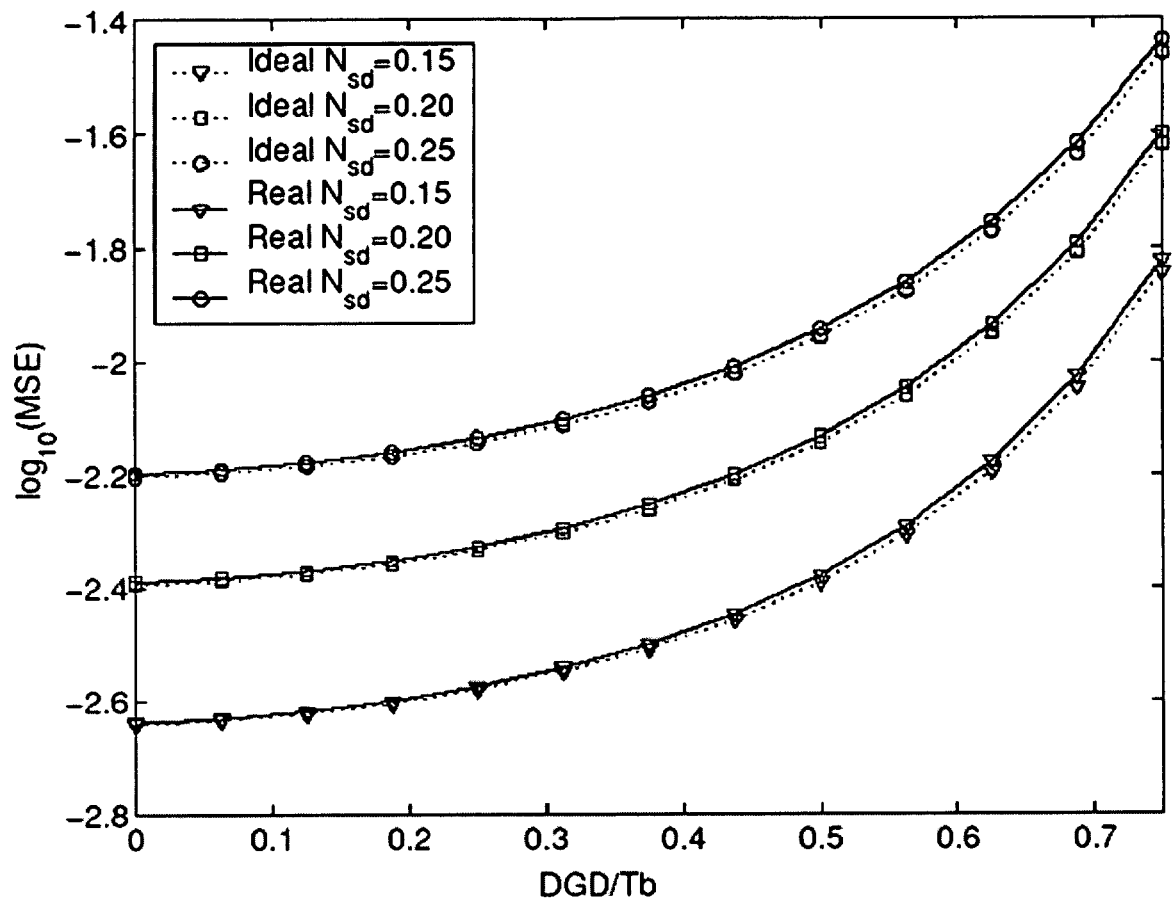
FIG. 13 compares magnitude an phase responses of an equalizer incorporating actual models for the spiral inductors and magnitude and phase responses of an equalizer with ideal inductors.

FIG. 13 shows the mean squared error (MSE) of an equalizer designed with ideal inductors, compared with that of an equalizer designed with non-ideal inductors that may be implemented.

Transconductor Design

Figure 14:
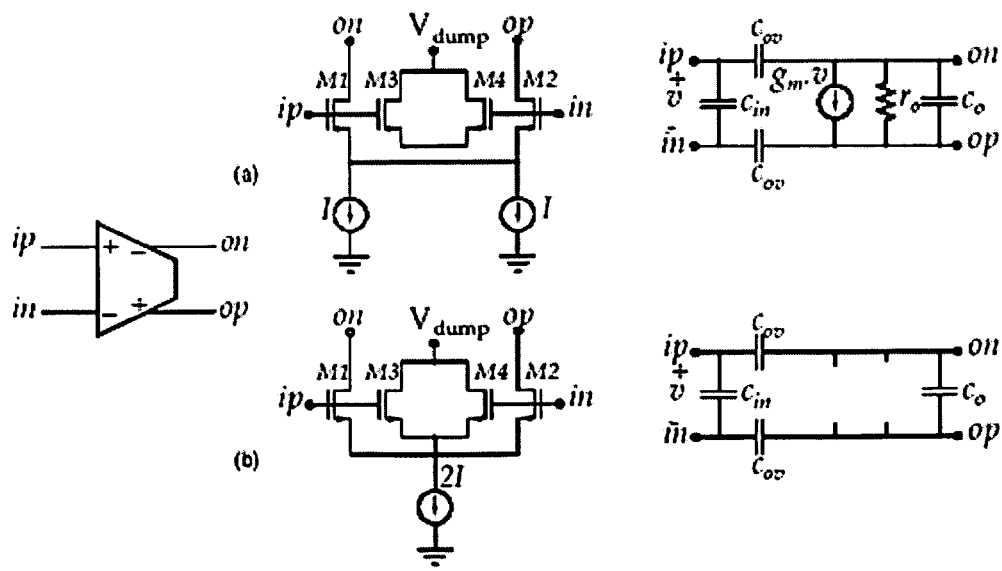
FIG. 14 shows a unit transconductor in accordance with one embodiment of the invention.

FIG. 14 shows a unit transconductor in accordance with one embodiment of the invention. In CMOS technology, it may be difficult to design a continuously programmable transconductor that can be varied over a wide range without compromising linearity. A range-switching strategy can be used to alleviate this problem. The upper portion of FIG. 14 labeled (a) shows a unit transconductor and its equivalent circuit when it is turned ON. The lower portion of FIG. 14 labeled (b) shows the unit transconductor and its equivalent circuit when it is turned OFF. According to the present embodiment of the invention, transconductor input and output capacitances are kept at stable values when switching takes place from an ON state to an OFF state, and vice versa. While transconductor design is described above, it should be understood that tab weights established for an equalizer filter in accordance with the inventions need not be restricted to an implementations utilizing transconductors.

Figure 15:
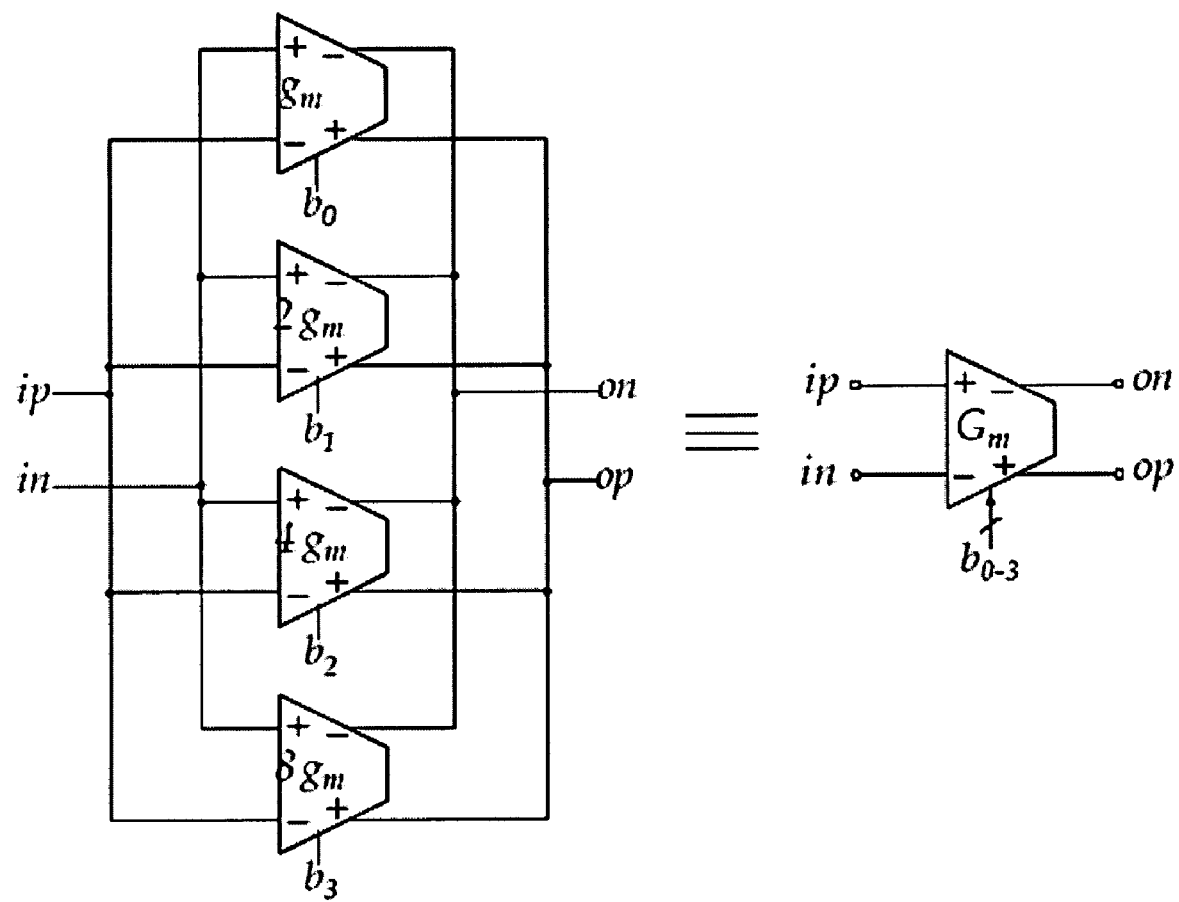
FIG. 15 shows an example of a 4-bit programmable transconductor in accordance with one embodiment of the present invention.

FIG. 15 shows an example of a 4-bit programmable transconductor in accordance with one embodiment of the present invention. As shown, this is a range-switched transconductor comprising four different transconductor elements. Each of the four transconductor elements is itself a unit transconductor capable of contributing to an output of the range-switched transconductor by generating an elemental output according to a different range of the multiplier factor. Here, the programmable transconductor is shown to utilize binary weighted versions of the unit element presented in FIG. 14. Furthermore, in case the programming resolution achievable by range-switching for the transconductor is insufficient, resolution may be increased by fine tuning the tail current. This may be done by continuously varying the tail currents of the transconductors that are "on," so that the total transconductance can span all values between successive ranges.

Designs for LCR network filters suitable for efficient adaptive equalization have been presented in various embodiments of the present invention. Such filters may be suitable for in implementing an LMS algorithm, variants of the LMS algorithm, such as the sign-sign and sign-gradient approaches, as well as other algorithms that minimize means squared error (MSE), such as a constant modulus algorithm (CMA).

While the present invention has been described in terms of specific embodiments, it should be apparent to those skilled in the art that the scope of the present invention is not limited to the described specific embodiments. The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

FIG. 1 illustrates a singly terminated inductor, capacitor, resistance (LCR) network filter in accordance with one embodiment of the invention. The state variables of this network are the capacitor voltages and inductor currents. Here, the LCR network is represented as an LC ladder and comprises a plurality of inductors connected in series to form an inductor chain and a plurality of capacitors each connected between a position along the inductor chain and a common position, shown in the figure as "ground." Components in the network such as inductors, capacitors, resistors, or others, may be implemented as passive elements or active elements. For example, such active elements may be constructed using transistors. Each state can be treated as an output of the network.

What is claimed is:

1. A method for performing channel equalization comprising:
   receiving a signal from a channel associated with inter-symbol interference (ISI);
   providing the received signal to an inductor, capacitor, resistance (LCR) network comprising a plurality of inductors and a plurality of capacitors;
   generating in the LCR network a first plurality of intermediate signals representing voltages associated with capacitors in the LCR network and a second plurality of intermediate signals representing currents associated with inductors in the LCR network, wherein the first plurality and second plurality of intermediate signals correspond to application of linearly independent impulse responses to the received signal;
   applying a corresponding one of a plurality of multiplier factors to each of the first plurality and second plurality of intermediate signals; and
   generating from the LCR network a resulting signal corresponding to an equalized version of the received signal.

2. The method of claim 1 wherein the applying step comprises detecting each of the first plurality and second plurality of intermediate signals and scaling each of the first plurality and second plurality of intermediate signals by the corresponding multiplier factor.

3. The method of claim 2 wherein each of the first plurality of intermediate signals is detected in voltage form, converted to current form, and scaled by the corresponding multiplier factor.

4. The method of claim 2 wherein each of the second plurality of intermediate signals is detected in voltage form using a sense resistor placed in series with an associated inductor in the LCR network, converted to current form, and scaled by the corresponding multiplier factor.

5. The method of claim 2 wherein each of the second plurality of intermediate signals is detected in voltage form using a sense inductor placed adjacent to and inductively coupled to an associated inductor in the LCR network, converted to current form, and scaled by the corresponding multiplier factor.

6. The method of claim 2 wherein the first plurality and second plurality of intermediate signals are scaled and combined to form a combined current signal, and the combined current signal is passed through a resistor to produce a voltage corresponding to the resulting signal.

7. The method of claim 1 wherein the applying step comprises driving each of the first plurality and second plurality of intermediate signals according to the corresponding multiplier factor.

8. The method of claim 1 wherein the LCR network comprises a primary network and a dual network, the primary network comprising a plurality of primary inductors and primary capacitors, the dual network comprising a plurality of dual inductors corresponding to the primary capacitors and a plurality of dual capacitors corresponding to the primary inductors.

9. The method of claim 8 wherein each of the first plurality of intermediate signals is obtained as a voltage signal associated with a primary capacitor in the primary network, and wherein each of the second plurality of intermediate signals is obtained as a voltage signal associated with a dual capacitor in the dual network.

10. The method of claim 1 wherein the LCR network is implemented as a differential circuit, wherein each of the first plurality of intermediate signals represents a differential voltage associated with a pair of capacitors, and wherein each of the second plurality of intermediate signals represents current associated with at least one of a pair of inductors.

11. The method of claim 10 wherein the pair of inductors are inductively coupled to one another.

12. The method of claim 11 wherein currents in the pair of inductors flow in opposite directions.

13. The method of claim 11 wherein the pair of inductors are inter-wound such that magnetic fields of the inductors reinforce one another.

14. The method of claim 1 wherein the LCR network is a passive network.

15. The method of claim 1 wherein the LCR network represents a Bessel filter having a bandwidth within an order of magnitude as a data transmission rate associated with the received signal.

16. The method of claim 1 further comprising a step of dynamically adjusting the multiplier factors to reduce an error measure based on the resulting signal.

17. The method of claim 16 wherein the multiplier factors are dynamically adjusted according to a least mean square (LMS) algorithm utilizing the first plurality and second plurality of intermediate signals as gradient signals.

18. The method of claim 1 wherein the corresponding multiplier factor is applied to each of the first plurality and second plurality of intermediate signals using a range-switched transconductor, the range-switched transconductor comprising a plurality of transconductor elements, each element capable of contributing to an output of the range-switched transconductor by generating an elemental output according to a different range of the corresponding multiplier factor.

19. A method for performing channel equalization comprising:

receiving a signal from a channel associated with inter-symbol interference (ISI);

applying a plurality of multiplier factors to the received signal to generate a plurality of weighted input signals;

providing the weighted input signals to different nodes of an inductor, capacitor, resistance (LCR) network comprising a plurality of inductors and a plurality of capacitors;

in response to the weighted input signals, generating in the LCR network a first plurality of intermediate signals representing voltages associated with capacitors in the LCR network and a second plurality of intermediate signals representing currents associated with inductors in the LCR network; and generating from the LCR network a resulting signal corresponding to an equalized version of the received signal.

20. The method of claim 19 wherein the LCR network comprises a primary network and a dual network, the primary network comprising a plurality of primary inductors and primary capacitors, the dual network comprising a plurality of dual inductors corresponding to the primary capacitors and a plurality of dual capacitors corresponding to the primary inductors.

21. The method of claim 20 wherein each of the first plurality of intermediate signals is obtained as a voltage signal associated with a primary capacitor in the primary network, and wherein each of the second plurality of intermediate signals is obtained as a voltage signal associated with a dual capacitor in the dual network.

22. The method of claim 19 wherein the LCR network is implemented as a differential circuit, wherein each of the first plurality of intermediate signals represents a differential voltage associated with a pair of capacitors, and wherein each of the second plurality of intermediate signals represents current associated with at least one of a pair of inductors.

23. The method of claim 19 wherein the plurality of multiplier factors are applied to the received signal using a plurality of range-switched transconductors, each range-switched transconductor comprising a plurality of transconductor elements, each element capable of contributing to an output of the range-switched transconductor by generating an elemental output according to a different range of the corresponding multiplier factor.

24. An apparatus for performing channel equalization comprising:

an inductor, capacitor, resistance (LCR) network, comprising a plurality of inductors and a plurality of capacitors, capable of receiving a signal from a channel associated with inter-symbol interference (ISI) and generating a first plurality of intermediate signals representing voltages associated with capacitors in the LCR network and a second plurality of intermediate signals representing currents associated with inductors in the LCR network, wherein the first plurality and second plurality of intermediate signals correspond to application of linearly independent impulse responses to the received signal;

a plurality of scaling elements configured to apply a corresponding one of a plurality of multiplier factors to each of the first plurality and second plurality of intermediate signals; and wherein the LCR network is configured to generate a resulting signal corresponding to an equalized version of the received signal.

25. The apparatus of claim 24 wherein the scaling elements are configured to detect each of the first plurality and second plurality of intermediate signals and scale each of the first plurality and second plurality of intermediate signals by the corresponding multiplier factor.

26. The apparatus of claim 25 further comprising a plurality of transconductors coupled to the LCR network, wherein each of the first plurality of intermediate signals is detected in voltage form, converted to current form, and scaled by a multiplier factor using one of the plurality of transconductors.

27. The apparatus of claim 25 further comprising a plurality of transconductors coupled to the LCR network, wherein each of the second plurality of intermediate signals is detected in voltage form using a sense resistor placed in series with an associated inductor in the LCR network, converted to current form, and scaled by a multiplier factor using one of the plurality of transconductors.

28. The apparatus of claim 25 further comprising a plurality of transconductors coupled to the LCR network, wherein each of the second plurality of intermediate signals is detected in voltage form using an associated sense inductor placed adjacent to and inductively coupled to a corresponding inductor in the LCR network, converted to current form, and scaled by a multiplier factor using the corresponding transconductor.

29. The apparatus of claim 25 wherein the first plurality and second plurality of intermediate signals are scaled and combined to form a combined current signal, and the combined current signal is passed through a resistor to produce a voltage corresponding to the resulting signal.

30. The apparatus of claim 24 wherein the scaling elements are configured to drive each of the first plurality and second plurality of intermediate signals according to the corresponding multiplier factor.

31. The apparatus of claim 24 wherein the LCR network comprises a primary network and a dual network, the primary network comprising a plurality of primary inductors and primary capacitors, the dual network comprising a plurality of dual inductors corresponding to the primary capacitors and a plurality of dual capacitors corresponding to the primary inductors.

32. The apparatus of claim 24 wherein each of the first plurality of intermediate signals is obtained as a voltage signal associated with a primary capacitor in the primary network, and wherein each of the second plurality of intermediate signals is obtained as a voltage signal associated with a dual capacitor in the dual network.

33. The apparatus of claim 24 wherein the LCR network is implemented as a differential circuit, wherein each of the first plurality of intermediate signals represents a differential voltage associated with a pair of capacitors, and wherein each of the second plurality of intermediate signals represents current associated with at least one of a pair of inductors.

34. The apparatus of claim 33 wherein the pair of inductors are inductively coupled to one another.

35. The apparatus of claim 34 wherein the pair of inductors allow currents to flow in opposite directions.

36. The apparatus of claim 34 wherein the pair of inductors are inter wound such that magnetic fields of the inductors reinforce one another.

37. The apparatus of claim 24 wherein the LCR network is a passive network.

38. The apparatus of claim 24 wherein the LCR network represents a Bessel filter having a bandwidth within an order of magnitude as a data transmission rate associated with the received signal.

39. The apparatus of claim 24 further comprising an adaptation module for dynamically adjusting the multiplier factors to reduce an error measure based on the resulting signal.

40. The apparatus of claim 39 wherein the multiplier factors are dynamically adjusted according to a least mean square (LMS) algorithm utilizing the first plurality and second plurality of intermediate signals as gradient signals.

41. The apparatus of claim 31 further comprising at least one range-switched transconductor coupled to the LCR network and capable of scaling each of the first plurality and second plurality of intermediate signals according to the corresponding multiplier factor, the range-switched transconductor comprising a plurality of transconductor elements, each element capable of contributing to an output of the range-switched transconductor by generating an elemental output according to a different range of the corresponding multiplier factor.

42. An apparatus for performing channel equalization comprising:
- an inductor, capacitor, resistance (LCR) network, comprising a plurality of inductors and a plurality of capacitors, capable of operating in response to a signal received from a channel associated with inter-symbol interference (IS I);
- a plurality of scaling elements configured to apply a corresponding one of a plurality of multiplier factors to the received signal to generate a plurality of weighted input signals;
- wherein the LCR network includes different nodes configured to receiving the plurality of weighted input signals; and
- wherein the LCR network is capable of generating a first plurality of intermediate signals representing voltages associated with capacitors in the LCR network and a second plurality of intermediate signals representing currents associated with inductors in the LCR network, in response to the weighted input signals; and
- wherein the LCR network is configured to generate a resulting signal corresponding to an equalized version of the received signal.

43. The apparatus of claim 42 wherein the LCR network comprises a primary network and a dual network, the primary network comprising a plurality of primary inductors and primary capacitors, the dual network comprising a plurality of dual inductors corresponding to the primary capacitors and a plurality of dual capacitors corresponding to the primary inductors.

44. The apparatus of claim 43 wherein each of the first plurality of intermediate signals is obtained as a voltage signal associated with a primary capacitor in the primary network, and wherein each of the second plurality of intermediate signals is obtained as a voltage signal associated with a dual capacitor in the dual network.

45. The apparatus of claim 42 wherein the LCR network is implemented as a differential circuit, wherein each of the first plurality of intermediate signals represents a differential voltage associated with a pair of capacitors, and wherein each of the second plurality of intermediate signals represents current associated with at least one of a pair of inductors.

46. The apparatus of claim 42 wherein the plurality of multiplier factors are applied to the received signal using a plurality of range-switched transconductors, each range-switched transconductor comprising a plurality of transconductor elements, each element capable of contributing to an output of the range-switched transconductor by generating an elemental output according to a different range of the corresponding multiplier factor.

47. A system for performing channel equalization comprising:
- means for receiving a signal from a channel associated with inter symbol interference (ISI);
- means for providing the received signal to an inductor, capacitor, resistance (LCR) network comprising a plurality of inductors and a plurality of capacitors;
- means for generating in the LCR network a first plurality of intermediate signals representing voltages associated with capacitors in the LCR network and a second plurality of intermediate signals representing currents associated with inductors in the LCR network, wherein the first plurality and second plurality of intermediate signals correspond to application of linearly independent impulse responses to the received signal;
- means for applying a corresponding one of a plurality of multiplier factors to each of the first plurality and second plurality of intermediate signals; and
- means for generating from the LCR network a resulting signal corresponding to an equalized version of the received signal.

* * * * *